US008937513B2

(12) United States Patent
DeNatale et al.

(10) Patent No.: US 8,937,513 B2
(45) Date of Patent: Jan. 20, 2015

(54) MICRO-SCALE SYSTEM TO PROVIDE THERMAL ISOLATION AND ELECTRICAL COMMUNICATION BETWEEN SUBSTRATES

(71) Applicant: Teledyne Scientific & Imaging, LLC, Thousand Oaks, CA (US)

(72) Inventors: Jeffrey F. DeNatale, Thousand Oaks, CA (US); Philip A. Stupar, Oxnard, CA (US); Yu-Hua Lin, Oak Park, CA (US); Robert L. Borwick, III, Thousand Oaks, CA (US); Alexandros P. Papavasiliou, Thousand Oaks, CA (US)

(73) Assignee: Teledyne Scientific & Imaging, LLC., Thousand Oaks, CA (US)

( * ) Notice: Subject to any disclaimer, the term of this patent is extended or adjusted under 35 U.S.C. 154(b) by 64 days.

(21) Appl. No.: 13/891,126

(22) Filed: May 9, 2013

(65) Prior Publication Data

US 2013/0293314 A1 Nov. 7, 2013

Related U.S. Application Data

(63) Continuation of application No. 13/105,735, filed on May 11, 2011, now Pat. No. 8,456,249.

(51) Int. Cl.

| | |
|---|---|
| ***G04F 5/14*** | (2006.01) |
| ***H01S 1/06*** | (2006.01) |
| ***B05D 3/10*** | (2006.01) |
| ***B05D 5/00*** | (2006.01) |
| ***B32B 15/08*** | (2006.01) |
| ***B32B 3/10*** | (2006.01) |

(Continued)

(52) U.S. Cl.

CPC ... *H01S 1/06* (2013.01); *B05D 3/10* (2013.01); *B05D 5/00* (2013.01); *B32B 15/08* (2013.01); *B32B 3/10* (2013.01); *B32B 3/12* (2013.01); *B32B 3/30* (2013.01); *C23F 1/00* (2013.01); *H01S 1/02* (2013.01); *H05K 1/14* (2013.01); *B81B 3/0081* (2013.01); *B81B 7/0006* (2013.01)

USPC ........................................................ 331/94.1

(58) Field of Classification Search

CPC .................................... H03L 7/26; G04F 5/14

USPC ............. 331/94.1, 3; 438/106, 107, 110, 116, 438/121, 455

See application file for complete search history.

(56) References Cited

U.S. PATENT DOCUMENTS

| | | | |
|---|---|---|---|
| 7,215,213 | B2 | 5/2007 | Mescher et al. |
| 2004/0219706 | A1 | 11/2004 | Wan |
| 2006/0022761 | A1 | 2/2006 | Abeles et al. |

OTHER PUBLICATIONS

Liger, et al., "Robust parylene-to-silicon mechanical anchoring", Micro Electro Mechanical Systems, 2003, MEMS-03 Kyoto, IEEE, Jan. 19-23, 2003, pp. 602-605.

(Continued)

*Primary Examiner* — Ryan Johnson

(74) *Attorney, Agent, or Firm* — Brooks Acordia IP Law, P.C.

(57) ABSTRACT

An apparatus includes a chip-scale atomic clock (CSAC) alkali vapor cell seated on a silicon substrate that is suspended in a package by a metalized Parylene strap having Parylene anchors embedded in a silicon frame, the Parylene strap comprising an extended rigidizing structure, and a plurality of electrical pins extending into an interior of the package, the plurality of electrical pins in electrical communication with the CSAC cell through the metalized Parylene strap, where the CSAC cell is mechanically connected to the package and thermally insulated from the package.

17 Claims, 7 Drawing Sheets

(51) Int. Cl.

| | |
|---|---|
| ***B32B 3/12*** | (2006.01) |
| ***B32B 3/30*** | (2006.01) |
| ***C23F 1/00*** | (2006.01) |
| ***H01S 1/02*** | (2006.01) |
| ***H05K 1/14*** | (2006.01) |
| ***B81B 3/00*** | (2006.01) |
| ***B81B 7/00*** | (2006.01) |

(56) References Cited

OTHER PUBLICATIONS

Non-Final Office action for U.S. Appl. No. 13/105,735 mailed May 11, 2011.
Notice of Allowance for U.S. Appl. No. 13/105,735 mailed Feb. 7, 2013.
Non-Final Office action for U.S. Appl. No. 13/105,735 mailed Sep. 4, 2012.

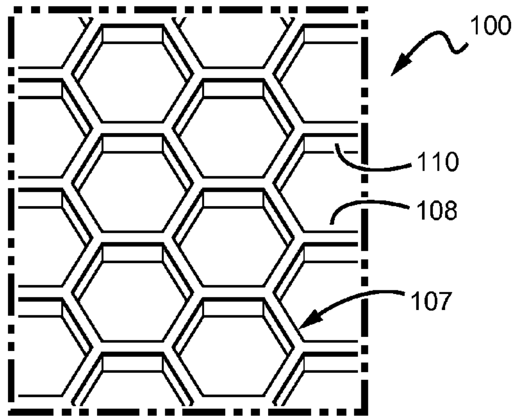
FIG. 5
FIG. 6
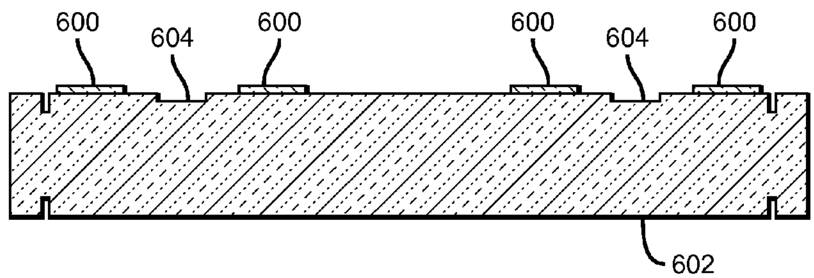
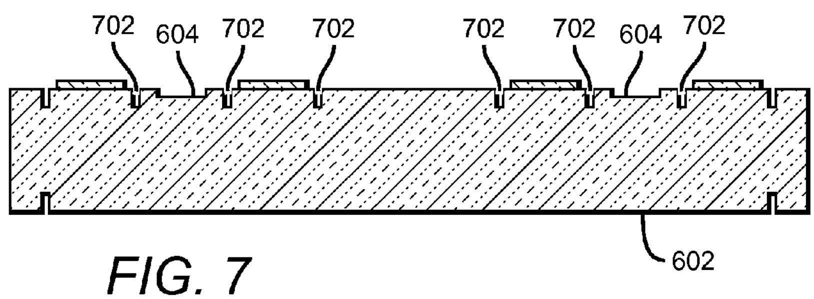
FIG. 7
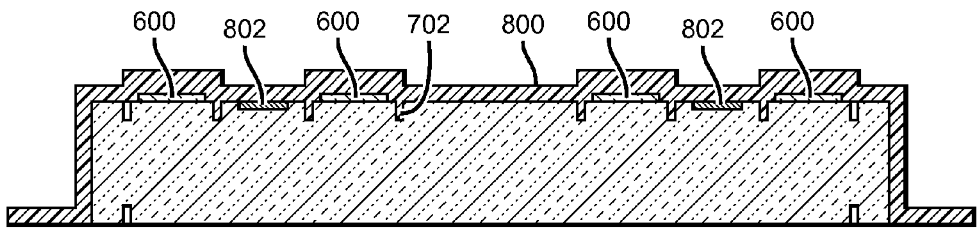
FIG. 8

MICRO-SCALE SYSTEM TO PROVIDE THERMAL ISOLATION AND ELECTRICAL COMMUNICATION BETWEEN SUBSTRATES

CROSS REFERENCE TO RELATED APPLICATIONS

This application is a continuation of U.S. patent application Ser. No. 13/105,735 filed May 11, 2011, which is hereby incorporated by reference herein for all purposes.

STATEMENT REGARDING FEDERALLY SPONSORED RESEARCH OR DEVELOPMENT

This invention was made with Government support under Contract No. N6601-02-C-8025 awarded by the U.S. Department of the Navy, Space and Naval Warfare Systems Command (SPAWAR) to Teledyne Scientific & Imaging, LLC (then known as Rockwell Scientific Company, LLC). The Government has certain rights in this invention.

BACKGROUND OF THE INVENTION

1. Field of the Invention

This invention relates to microstructures, and more particularly to devices for providing structural support and electrical signals to an inner micro-support structure.

2. Description of the Related Art

Thermal isolation of micro-scale electrical and optoelectronic components can be important for components that are required to be at a temperature that is de-coupled from their external environment.

Chip-scale atomic devices such as chip-scale atomic clocks ("CSAC"), for example, may require thermal isolation of particular components from their environment and from the package enclosure in which they sit to reduce thermal losses and hence heating power required to thermally bias the components. Unfortunately, thermal isolation is not the only packaging design consideration. Power and signaling must also be provided to the CSAC components (typically including portions of the "physics package" such as the vapor cell and/or vertical-cavity surface-emitting laser (VCSEL) optical source) to achieve the necessary thermal bias and temperature control, or in the case of the VCSEL to generate the required optical output for generation and interrogation of the atomic states in the vapor cell. These power and signaling requirements necessitate an electrical and physical connection between the physics package components, the enclosure in which they sit and external devices, thus complicating thermal isolation efforts for the physics package. Kapton flex cables may be used for such connections, but their use results in disadvantageous thermal coupling between the physics package components and the enclosure in which they sit. More generally, thermal isolation between adjacent substrates used in other types of systems and other types of physics packages is a problem that is complicated by conflicting requirements of power and signaling communication between them.

A need continues to exist to provide power and signaling to micro-scale components while minimizing thermal communication with their environment.

SUMMARY OF THE INVENTION

A structure is disclosed that has a microscale rigidized Parylene strap conformally coupled to both a first silicon substrate and to a second silicon substrate such that the first silicon substrate is suspended from the second silicon substrate through the strap.

A method is disclosed that includes conformally coating Parylene onto a rigidizing structure mold to form a rigidized Parylene layer, etching the rigidized Parylene layer to expose a center portion of a substrate; and etching entirely through an annulus portion of the substrate to free a suspended portion of the rigidized Parylene layer between outer and inner substrate portions so that one of the outer and inner substrate portions are suspended by the other substrate portion by the rigidized Parylene layer.

BRIEF DESCRIPTION OF THE DRAWINGS

The components in the figures are not necessarily to scale, emphasis instead being placed upon illustrating the principals of the invention. Like reference numerals designate corresponding parts throughout the different views.

FIG. 5 is a perspective view of the bottom of the rigidized Parylene strap illustrated in FIG. 1, showing the honeycomb reinforcement structure.

FIGS. 6-14 illustrate semiconductor processing steps for an inner annular silicon frame suspended by an outer annular silicon frame by a rigidized Parylene strap;

DETAILED DESCRIPTION OF THE INVENTION

A system for structurally suspending and electrically connecting substrates in a microscale system includes a conformally-coated and rigidized Paraxylyene, referred to herein as a "Parylene," strap, suspending a frame (which is preferably silicon) from a support (which is preferably silicon). Although the description that follows uses the tradename "Parylene" in place of Paraxylyene, it is understood in this description that references to the term "Parylene" are intended to preferably include at least the Paraxylyene material known in the industry as Parylene-C, and also other Paraxylene formulations which may include Parylene-N, Parylene-D and Parylene-HT.

Figure 1:
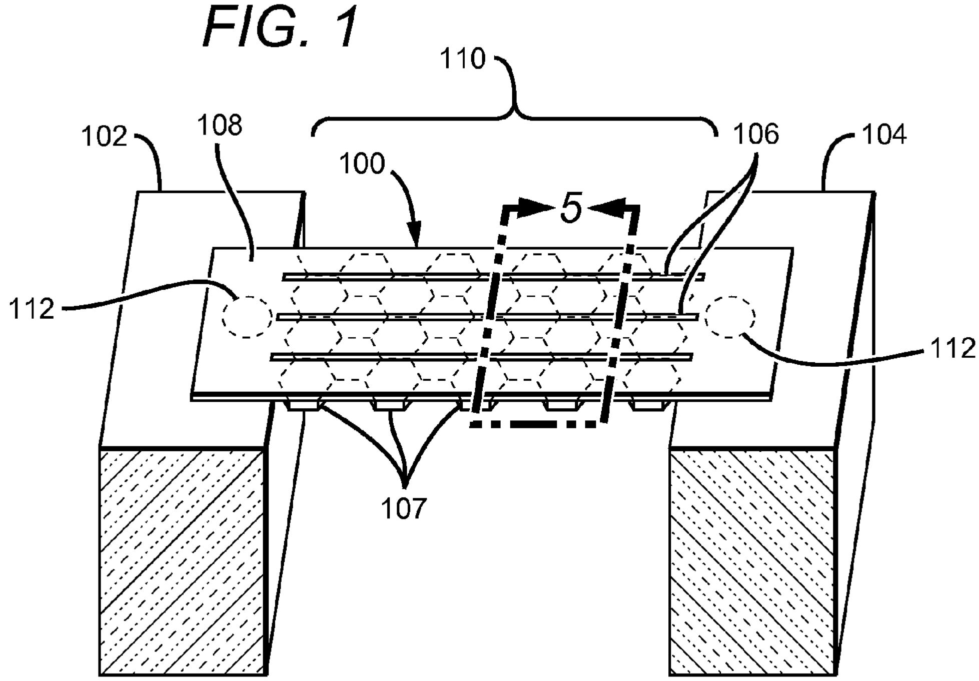
FIG. 1 is a cross-sectional perspective view of one embodiment of a rigidized Parylene strap suspending an inner silicon frame from an outer silicon support.

In one implementation illustrated in FIG. 1, a microscale and rigidized Parylene strap 100 enables one substrate to support and suspend the other substrate for thermal isolation and electrical communication. The rigidized Parylene strap 100 has Parylene 108 conformally coated (or "seated") on the substrates (102, 104) and is formed with a reinforcement structure extending from one side, such as a honeycomb reinforcement structure 107. In other embodiments, the rigidized Parylene strap is formed of other reinforcement structures such as in the form of one or more Parylene box-beam structures (see FIGS. 15, 16). The rigidized Parylene strap 100 preferably has a plurality of conductive traces 106 (preferably formed of metallic material) deposited on the layer of Parylene 108 to enable electrical communication between the substrates (102, 104), including power signals, while allowing one substrate to be suspended from the other to increase thermal insulation between them. In a preferred embodiment the substrates form a circular inner annulus frame 102 and a circular outer annulus frame 104 with one annulus frame physically suspending the other (See FIG. 2). In other embodiments, the inner and out annulus frames are square annulus frames (e.g. FIG. 15). The substrates are preferably formed of a material such as Silicon (Si) that are etched from a single wafer substrate in which a suspended portion 110 of the Parylene strap is created by etching the wafer to free the strap. Parylene anchor holes are preferably formed by etching in each of the inner annulus frame 102 and outer annulus frame 104 to receive Parylene anchors 112 for increased mechanical adherence to the substrates. In an alternative embodiment the substrate may be formed of Gallium Arsenide (GaAs), borosilicate glass, ceramics or other substrate material. As used in this disclosure, the word "rigidized" is intended to mean a Parylene strap that has a reinforcement structure extending from it on at least one side to change the bending, torsion and vibration characteristics of the otherwise planar Parylene layer, at least across the suspended portion 110.

Figure 2:
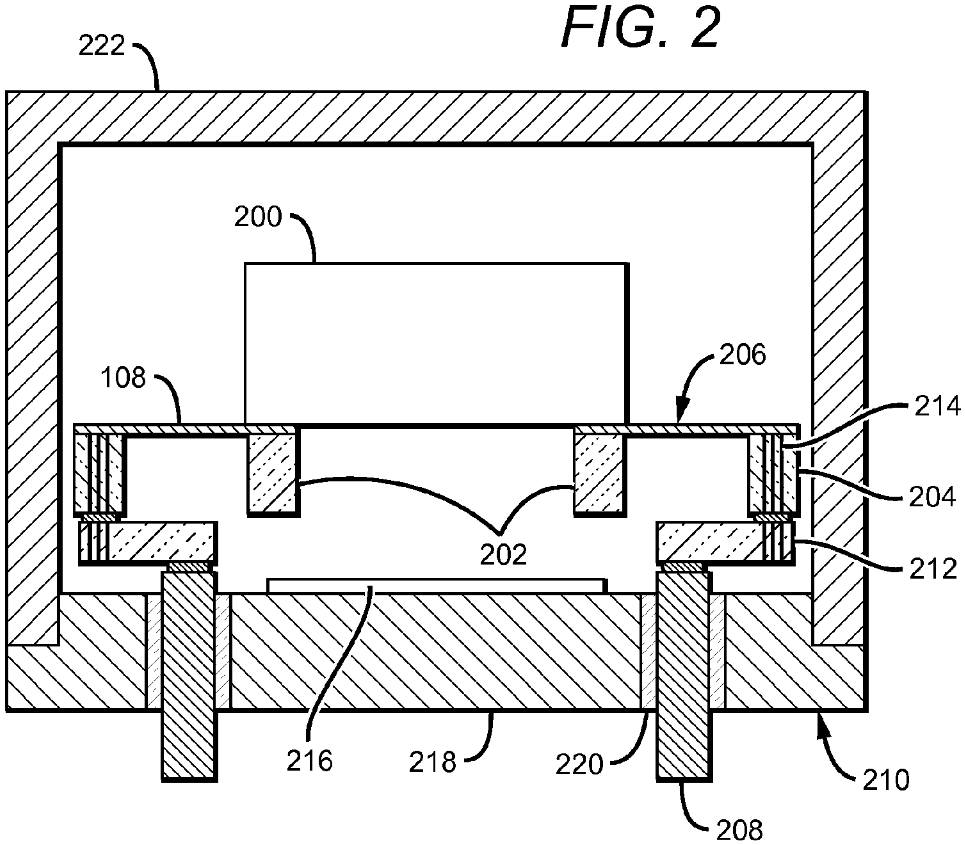
FIG. 2 is a cross-sectional view of one embodiment of a CSAC module that uses the rigidized Parylene strap illustrated in FIG. 1 to suspend a physics package subsystem on an inner silicon frame for thermal isolation and electrical communication.

FIG. 2 illustrates one application for the rigidized Parylene strap and substrate assembly illustrated in FIG. 1 that suspends a portion of the physics package components over a detector in a chip-scale atomic device that is a clock (CSAC) assembly. The physics package components 200 are seated on an inner silicon frame 202 (to define a "substrate frame") that is suspended from an outer silicon frame 204 preferably through a plurality of rigidized Parylene straps 206. In an alternative embodiment, the plurality of Parylene straps 206 may consist of one or more rigidized drum straps that extend around a substantial perimeter of the inner and outer silicon frames (202, 204).

The inner and outer silicon frames (202, 204) are preferably annular, with the Parylene strap 206 metalized with a plurality of conductive traces 106 to provide electrical communication to the physics package components 200. At least one of the plurality of traces 106 is in communication with an electrical pin 208 of a package base, which may be a package base 210 such as a Transistor Outline Header ("TO Header") through a lower silicon frame 212 that supports the outer annular silicon frame 204. Although the electrical signal path between the plurality of traces 108 and electrical pin 208 is illustrated as a combination of surface-level conductive traces 106 and substrate vias 214, in a preferred embodiment, electrical communication between the lower silicon frame 212 and plurality of conductive traces 106 is by means of trace and trace bonds (not shown).

A detector 216 is seated on the package base 210 in a position to receive a laser beam provided by the physics package components 200. A base 218 of the package base 210 is itself supported by the electrical pins 208 extending through glass welds 220 of the package base 210, with the physics package components 200, inner and outer annular substrates (202, 204) and detector 216 components sealed from the environment with a cap 222 that is preferably welded onto the package base 210. In an alternative embodiment, the chip-scale atomic device 200 is not a CSAC, but any chip-scale device that performs interrogation of atomic states in a vapor cell, such as a chip-scale gyroscope or chip-scale magnetometer.

Figure 3:
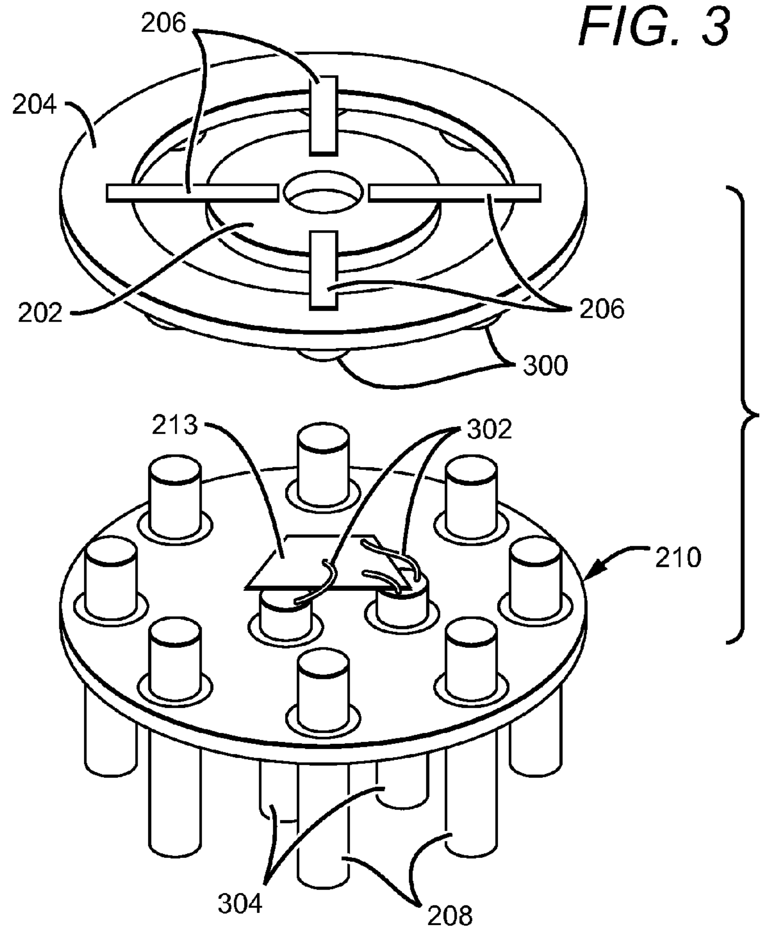
FIG. 3 is a perspective view of a TO header style package, inner silicon frame and outer silicon support used in the system of FIG. 2.

FIG. 3 illustrates a perspective embodiment of the inner and outer annular silicon frames and TO header, exposed without the cap and physics package. Electrical pins 208 of the package base 210 are aligned with solder bumps 300 to seat the outer annular frame 204. The inner annular frame 202 is suspended from the outer annular frame 204 by Parylene straps 206 that also provide electrical communication and thermal isolation between inner and outer annular frames (202, 204). Traces 302 are coupled between the detector 213 and respective electrical pins 304 to provide power and electrical communication between the detector 213 and external electronics (not shown). Although the inner and outer annular frames (202, 204) are illustrated as generally annular, an alternative embodiment they may each be square or conformed to another polygonal shape. Similarly, although four Parylene straps 206 are illustrated to effectuate suspension of the inner annulus frame 202 from the outer annulus frame 204, in an alternative embodiment the Parylene strap is a Parylene drum extending substantially entirely around and between the frames (202, 204) to provide suspension of the inner annular frame 202.

Figure 4:
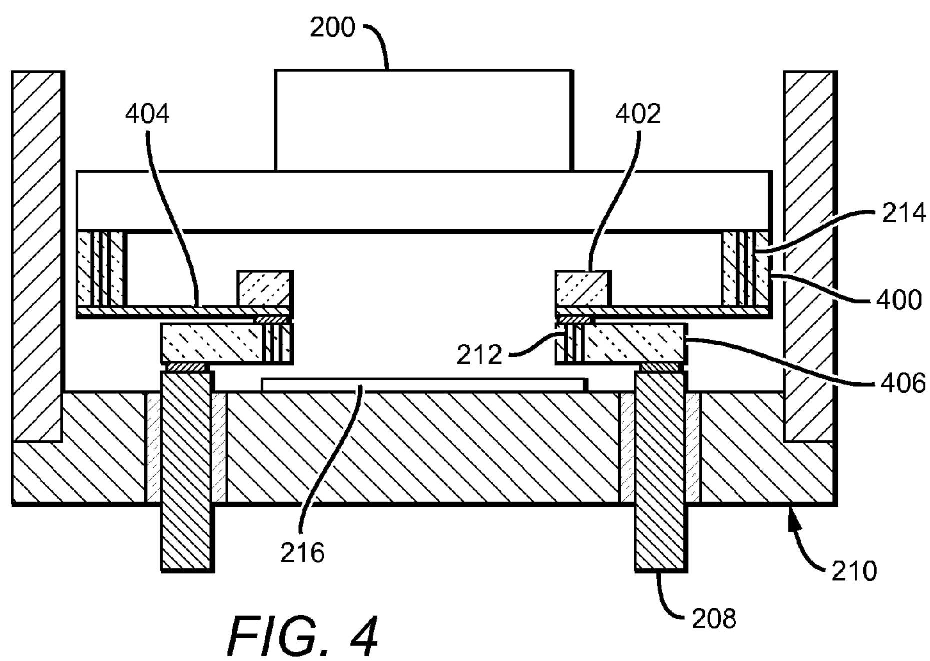
FIG. 4 is a cross-sectional view of another embodiment of a CSAC module that uses the rigidized Parylene strap illustrated in FIG. 1 to suspend a physics package subsystem on an outer silicon frame for thermal isolation and electrical communication.

FIG. 4 illustrates an alternative embodiment of physics package components 200 supported by an exterior annular frame 400 that is suspended from an inner annular frame 402 by a plurality of rigidized Parylene straps 404. In this embodiment, a lower silicon frame 406 supports the inner annular frame 402 and is seated on the electrical pins 208 of a package base 210. The combination of the outer annular frame 400 suspended by the inner annular frame 402 through the rigidized Parylene straps 404 provide thermal isolation and mechanical support for the physics package components 200 in the center of the assembly over the detector that is positioned in complimentary opposition to the physics package components 200 to receive an uninterrogated laser beam. Although communication between the physics package components 200 and the electrical pins 208 is illustrated by means of substrate vias 214, in a preferred embodiment, such communication between the electrical pin 208 and inner annular frame 402 is provided by conductive traces and trace bonds, similar to communication between the Parylene strap 404 and physics package components 200.

FIG. 5 illustrates a side of the rigidized Parylene strap 100 that has the honeycomb reinforcement structure 107. In a preferred embodiment, the honeycomb reinforcement structure 107 has walls 110 that extend from the Parylene layer 108 to a height of about 60 um, with the walls of being approximately 17 um wide. Although the honeycomb reinforcement structure 107 is illustrated as hexagonal, the honeycomb reinforcement structure may form a pentagon, heptagon, octagon or other geometric cross section. Other dimensions may be chosen to optimize the mechanical rigidity of the structure.

Figure 9:
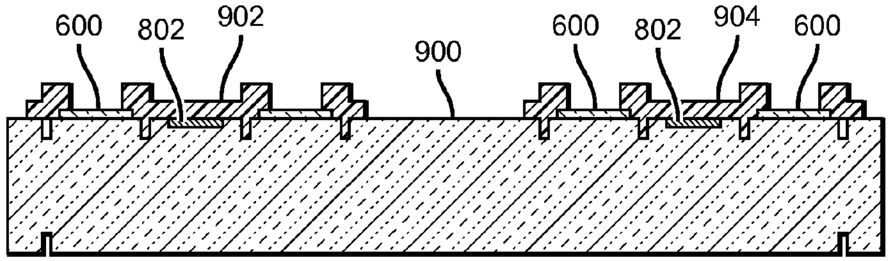
Figure 10:
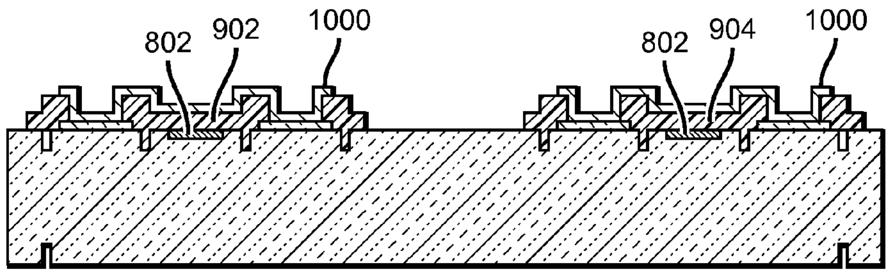
Figure 11:
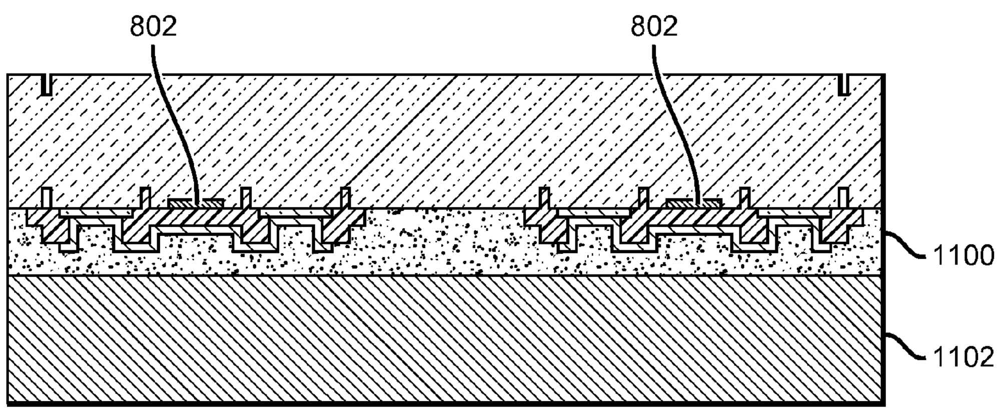
Figure 12:
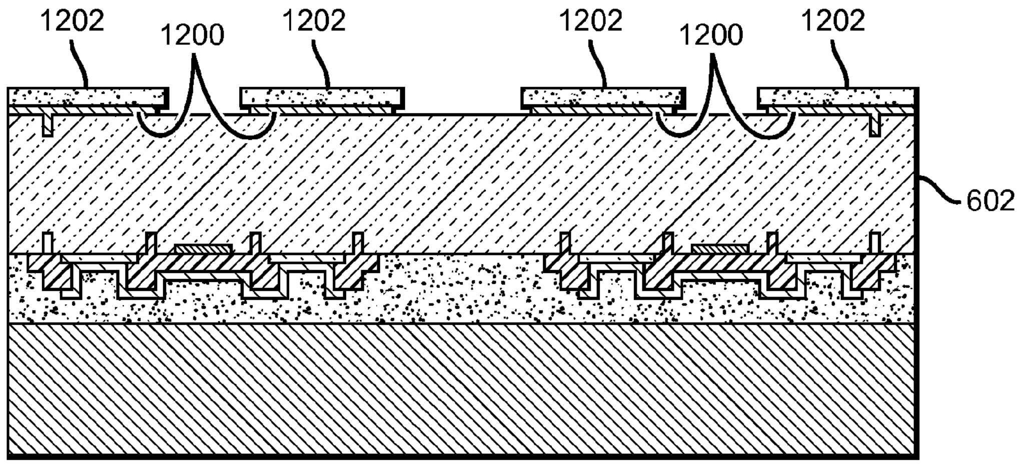
Figure 13:
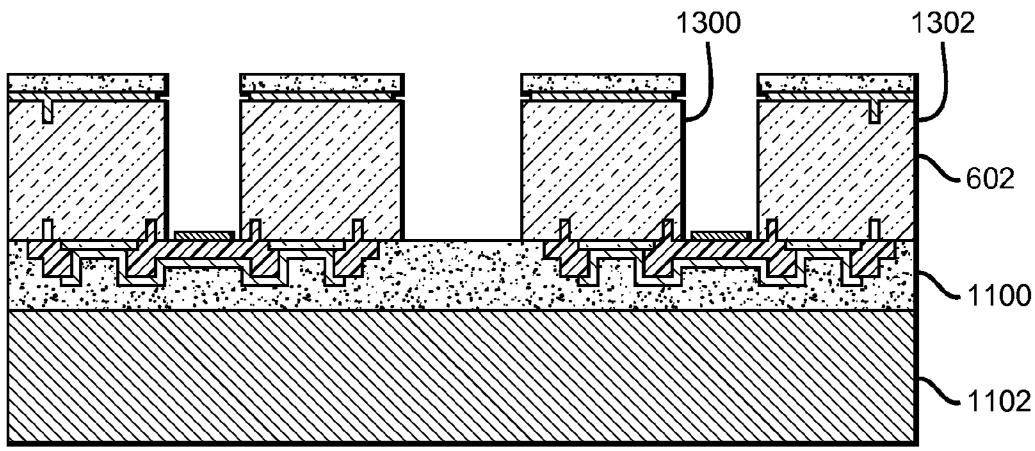
Figure 14:
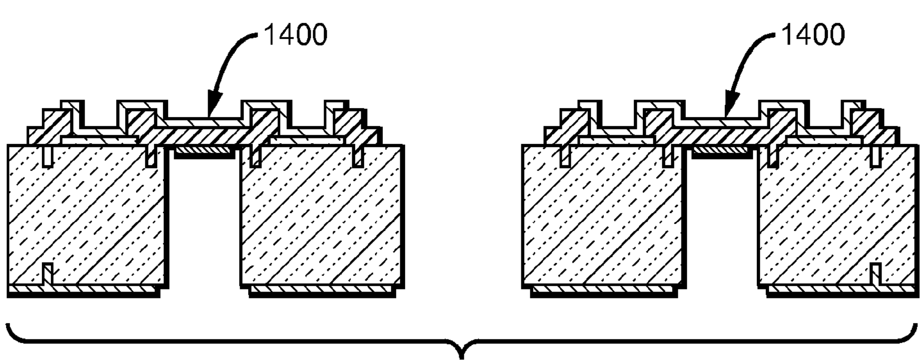

FIGS. 6 through 14 illustrate the fabrication steps for the inner and outer annular silicon frames (402, 400) and Parylene strap 404 combination first illustrated in FIG. 4. A film of silicon dioxide is deposited on a substrate, preferably a silicon substrate 602, and then the silicon dioxide film is patterned into islands 600 (alternatively referred to as "dielectric pads"). A plurality of blind anchor holes 702 are etched into the substrate to facilitate later anchoring of a Parylene layer to the substrate 602. An extended rigidizing structure mold 604, preferably in a honeycomb pattern, is etched into the substrate to receive conformally coated Parylene which will ultimately form a rigidized honeycomb structure (See FIG. 1, reference numeral 107). In FIG. 8, a layer of Parylene 800 is deposited over the oxide pads 600 and into the rigidizing structure mold 604 and anchor holes 702 (forming respective Parylene tabs) to form a conformally seated Parylene layer having a rigidizing structure 802 that is as-yet embedded in the silicon substrate 602. In FIG. 9, the Parylene layer at a substrate center portion 900 is removed and the silicon dioxide pads 600 partially exposed to define the parylene straps (902, 904) In FIG. 10, the first and second Parylene straps (902, 904) are coated with patterned metal to form a plurality of traces 1000 and an optional second layer of Parylene (not shown) may be deposited to protect the traces. In FIG. 11, substrate 602 is attached face-down to a handle wafer 1102 using photoresist layer 1100 as adhesive. In FIG. 12, metal substrate contacts 1200 are deposited on the back side of substrate 602. A second photo resist layer 1202 is formed on the back side of the substrate 602 to enable etching, in FIG. 13, of the substrate 602 and formation of the inner annular silicon frame 1300 and outer annular silicon frame 1302. In FIG. 14, the handle wafer 1102 and photo resist 1100 are removed to expose the now-defined rigidized Parylene strap 1400.

Figure 15:
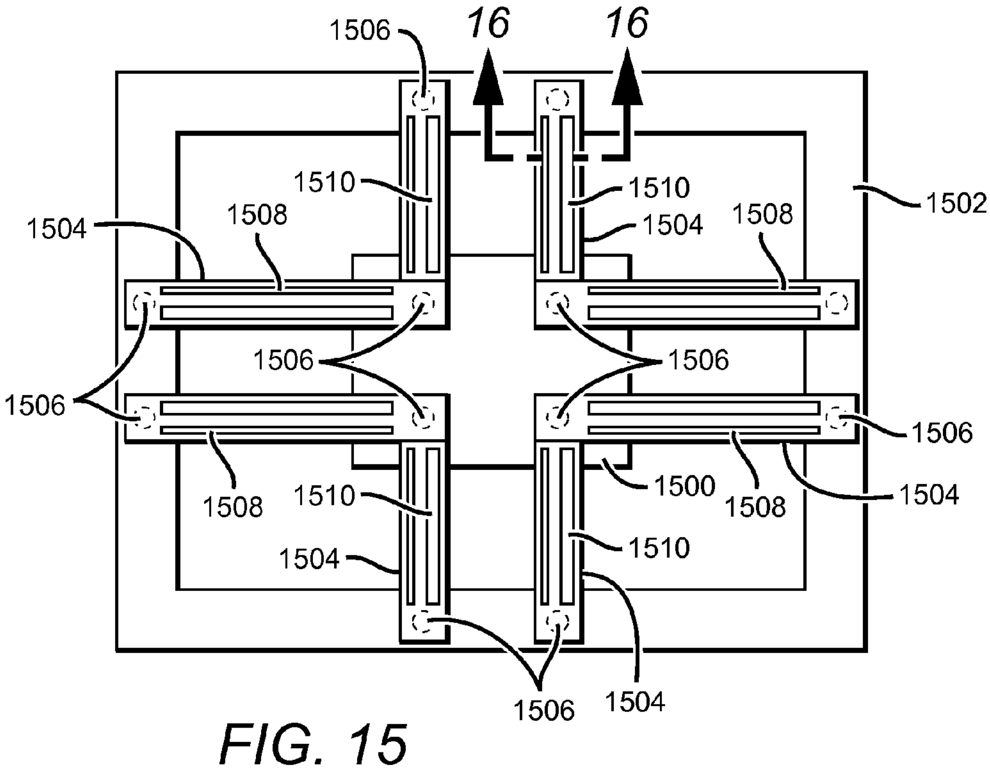
FIG. 15 illustrates a plan view of a rectangular inner substrate suspended by an outer rectangular frame by, in one embodiment, a Parylene strap having a box beam configuration.

FIG. 15 illustrates one embodiment of an inner substrate 1500 (preferably a silicon substrate) that is suspended by an outer substrate 1502 (also preferably a silicon substrate) through Parylene straps 1504 that has a box-beam strap portion. The rigidized Parylene straps 1504 have Parylene anchors 1506 at their proximal and distal ends embedded in each of the inner and outer substrates (1500, 1502). At least one of the rigidized Parylene straps 1504 has a metalized trace 1508 deposited on the straps and extending between the inner and outer substrates (1500, 1502) to provide electrical communication between them. The Parylene straps 1504 preferably include a box beam strap portion 1510 formed during the strap's fabrication process to provide increased resistance to torsion and bending moments. In an alternative embodiment, the box beam strap portion 1510 is instead a honeycomb reinforcement structure (not shown). Also, the metalized trace 1508 may be deposited on the box beam structure 1510 or may consist of a plurality of metalized traces.

Figure 16:
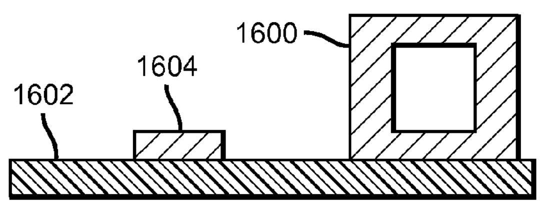
FIG. 16 is a cross section view of the Parylene strap illustrated in FIG. 15 and along the line 16-16.

FIG. 16 illustrates a cross section of a Parylene strap about the line 16-16 in FIG. 15. A box beam type structure 1600 formed of Parylene is established on the Parylene layer 1602. The dimensions of the box beam structure would be chosen to control the stiffness of the strap in bending and torsion. A metallic trace 1604 is seated on the Parylene layer 1602.

Figure 17:
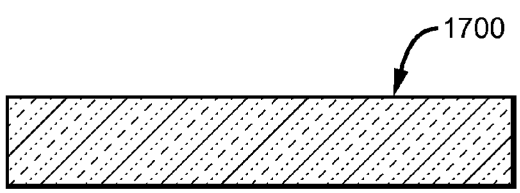
FIGS. 17-24 illustrate processing steps for forming parylene straps which are rigidized with a box-beam structure.
Figure 18:
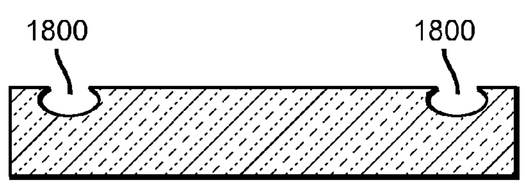
Figure 19:
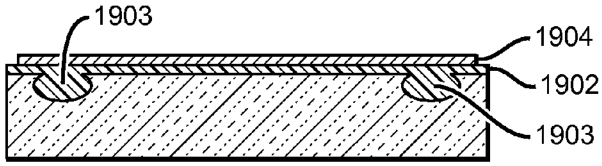
Figure 20:
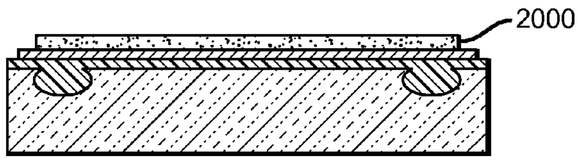
Figure 21:
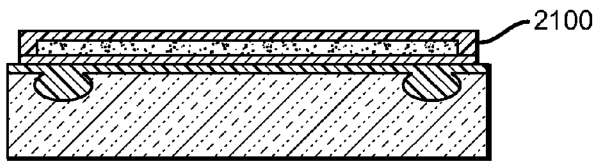
Figure 22:
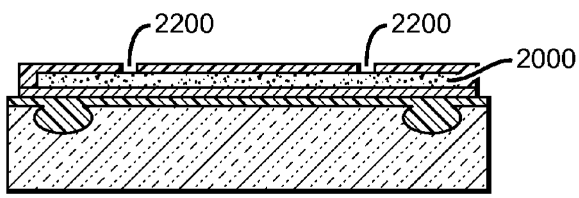
Figure 23:
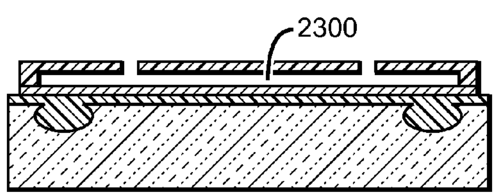
Figure 24:
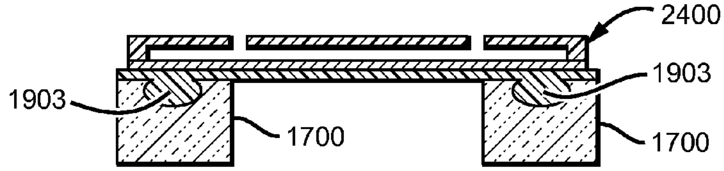

FIGS. 17-24 illustrate one embodiment of fabrication steps for the rigidized Parylene straps illustrated in FIG. 16. FIG. 17 illustrates the silicon substrate 1700 before processing. FIG. 18 shows formation of anchor recesses 1800 in the silicon wafer 1700. FIG. 19 illustrates a base Parylene layer 1902 deposited on the surface of the wafer 1700 and into and substantially filling the anchor recesses 1800 to form Parylene tabs 1903. Metallic traces 1904 are patterned on the base Parylene layer 1902. In FIG. 21, a rigidizing structure mold, preferably in the form of a thick resist layer 2000, is coated on a portion of the base Parylene layer 1902, with the resist having dimensions that will form the cavity of the box beam type rigidizing structure. A second layer of Parylene 2100 is confomally deposited on the thick resist 2000. In FIG. 22, release holes 2200 are etched to enable removal of the thick resist layer 2000. In FIG. 23, the substrate is immersed in solvent which dissolves the thick photoresist structure 2000 through the release holes 2200 forming the box beam cavity 2300. In FIG. 24, the silicon wafer 1700 is etched to create inner and outer substrates and to suspend a portion of the now-rigidized Parylene strap 2400. Other sacrificial materials besides photoresist may also be used.

While various implementations of the application have been described, it will be apparent to those of ordinary skill in the art that many more embodiments and implementations are possible that are within the scope of this invention.

We claim:

1. An apparatus, comprising:

a chip-scale atomic clock (CSAC) alkali vapor cell seated on a silicon substrate that is suspended in a package by a metalized Parylene strap having Parylene anchors embedded in a silicon frame, said Parylene strap comprising an extended rigidizing structure; and a plurality of electrical pins extending into an interior of said package, said plurality of electrical pins in electrical communication with said CSAC cell through said metalized Parylene strap;

wherein said CSAC cell is mechanically connected to said package and thermally insulated from said package.

2. The apparatus of claim 1, wherein said electrical communication is provided by a combination of a plurality of surface-level conductive traces and substrate vias.

3. The apparatus of claim 1, wherein said electrical communication is provided by a plurality of conductive traces and trace bonds.

4. The apparatus of claim 1, wherein said silicon frame is annular.

5. The apparatus of claim 1, wherein said silicon frame is a polygonal shape.

6. The apparatus of claim 1, wherein said extended rigidizing structure is a honeycomb reinforcement structure.

7. The apparatus of claim 1, wherein said extended rigidizing structure is a box-beam structure.

8. The apparatus of claim 1, further comprising:

a detector in said package and positioned in complementary opposition from said suspended CSAC cell.

9. The apparatus of claim 8, wherein said rigidized Parylene strap comprises a plurality of polygonal straps conformally coated to said silicon substrate and said silicon frame.

10. The apparatus of claim 9, wherein said rigidized Parylene strap comprises a drum strap extending circumferentially between said silicon substrate and said silicon frame.

11. The apparatus of claim 8, wherein said detector is in electrical communication with said plurality of electrical pins through a plurality of conductive traces.

12. The apparatus of claim 8, wherein said package further comprises a package base.

13. The apparatus of claim 12, wherein said detector is seated on said package base in a position to receive a laser beam provided by the CSAC.

14. The apparatus of claim 12, wherein said package base is a Transistor Outline (TO) Header.

15. The apparatus of claim 12, wherein said plurality of electrical pins extending into the interior of said package extend through a plurality of glass welds in said package base.

16. The apparatus of claim 12, wherein said package further comprises a package cap.

17. The apparatus of claim 16, wherein said package cap is welded onto said package base.

* * * * *